(12) United States Patent
Cho et al.

(10) Patent No.: US 11,978,821 B2
(45) Date of Patent: May 7, 2024

(54) SEMICONDUCTOR LIGHT EMITTING ELEMENT WITH MAGNETIC LAYER, MANUFACTURING METHOD THEREOF, AND DISPLAY DEVICE INCLUDING THE SAME

(71) Applicant: LG ELECTRONICS INC., Seoul (KR)

(72) Inventors: Byoungkwon Cho, Seoul (KR); Junghoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 143 days.

(21) Appl. No.: 17/550,743

(22) Filed: Dec. 14, 2021

(65) Prior Publication Data

US 2022/0102579 A1    Mar. 31, 2022

Related U.S. Application Data

(63) Continuation of application No. 16/691,113, filed on Nov. 21, 2019, now Pat. No. 11,233,169.

(30) Foreign Application Priority Data

Jan. 31, 2019    (KR) ........................ 10-2019-0013019

(51) Int. Cl.
*H01L 27/15*    (2006.01)
*H01L 25/075*    (2006.01)
(Continued)

(52) U.S. Cl.
CPC ...... *H01L 33/0016* (2013.01); *H01L 25/0753* (2013.01); *H01L 33/0095* (2013.01); *H01L 33/60* (2013.01); *H01L 2933/0058* (2013.01)

(58) Field of Classification Search
CPC ............. H01L 33/0016; H01L 33/0095; H01L 25/0753; H01L 33/60; H01L 2933/0058; H01L 33/46; H01L 33/44
See application file for complete search history.

(56) References Cited

U.S. PATENT DOCUMENTS 6,784,462 B2    8/2004 Schubert
7,767,996 B2    8/2010 Xuan et al.
(Continued)

FOREIGN PATENT DOCUMENTS

JP    2010-225852 A    10/2010
KR    10-2010-0092116 A    8/2010
(Continued)

*Primary Examiner* — Ismail A Muse
(74) *Attorney, Agent, or Firm* — Birch, Stewart, Kolasch & Birch, LLP

(57) ABSTRACT

A semiconductor light emitting element can include an n-type semiconductor layer, a p-type semiconductor layer in a first region on the n-type semiconductor layer, a p-type electrode on the p-type semiconductor layer, an n-type electrode in a second region different from the first region on the n-type semiconductor layer, a magnetic layer under the n-type semiconductor layer, a reflective layer between the n-type semiconductor layer and the magnetic layer, and a passivation layer surrounding the n-type semiconductor layer, the p-type semiconductor layer, the p-type electrode, the n-type electrode, and the magnetic layer.

18 Claims, 12 Drawing Sheets

(51) Int. Cl.
*H01L 29/26* (2006.01)
*H01L 31/12* (2006.01)
*H01L 33/00* (2010.01)
*H01L 33/60* (2010.01)

(56) References Cited

U.S. PATENT DOCUMENTS

| | | |
|---|---|---|
| 7,906,786 B2 | 3/2011 | Xuan et al. |
| 7,928,463 B2 | 4/2011 | Xuan |
| 7,989,818 B2 | 8/2011 | Xuan et al. |
| 8,154,041 B2 | 4/2012 | Yim |
| 8,502,259 B2 | 8/2013 | Xuan et al. |
| 8,536,614 B2 | 9/2013 | Hsu et al. |
| RE46,004 E | 5/2016 | Homg et al. |
| 9,437,785 B2 | 9/2016 | Bergmann et al. |
| 2003/0111667 A1 | 6/2003 | Schubert |
| 2003/0127644 A1 | 7/2003 | Chen |
| 2005/0072968 A1 | 4/2005 | Tsai et al. |
| 2005/0156183 A1 | 7/2005 | Tsai et al. |
| 2006/0091409 A1 | 5/2006 | Epler et al. |
| 2007/0004066 A1 | 1/2007 | Wuu et al. |
| 2007/0214878 A1 | 9/2007 | Anderson |
| 2009/0014747 A1 | 1/2009 | Shiue et al. |
| 2009/0127575 A1 | 5/2009 | Homg et al. |
| 2009/0152583 A1 | 6/2009 | Chen et al. |
| 2009/0179209 A1* | 7/2009 | Xuan ............... H01L 33/38 257/E33.064 |
| 2009/0236629 A1 | 9/2009 | Nishikawa et al. |
| 2010/0136728 A1 | 6/2010 | Homg et al. |
| 2011/0114989 A1 | 5/2011 | Suehiro et al. |
| 2011/0215346 A1 | 9/2011 | Yoon et al. |
| 2012/0164770 A1 | 6/2012 | Hahn et al. |
| 2013/0175563 A1 | 7/2013 | Wang et al. |
| 2014/0077242 A1* | 3/2014 | Lee ............... H01L 33/60 257/98 |
| 2016/0247963 A1 | 8/2016 | Bae et al. |
| 2018/0374985 A1* | 12/2018 | Chen ............... H01L 33/007 |
| 2019/0123240 A1 | 4/2019 | Kang et al. |
| 2019/0165206 A1 | 5/2019 | Chen et al. |

FOREIGN PATENT DOCUMENTS

| | | |
|---|---|---|
| KR | 10-2011-0110957 A | 10/2011 |
| KR | 10-2013-0125871 A | 11/2013 |
| KR | 10-2018-0053481 A | 5/2016 |

* cited by examiner

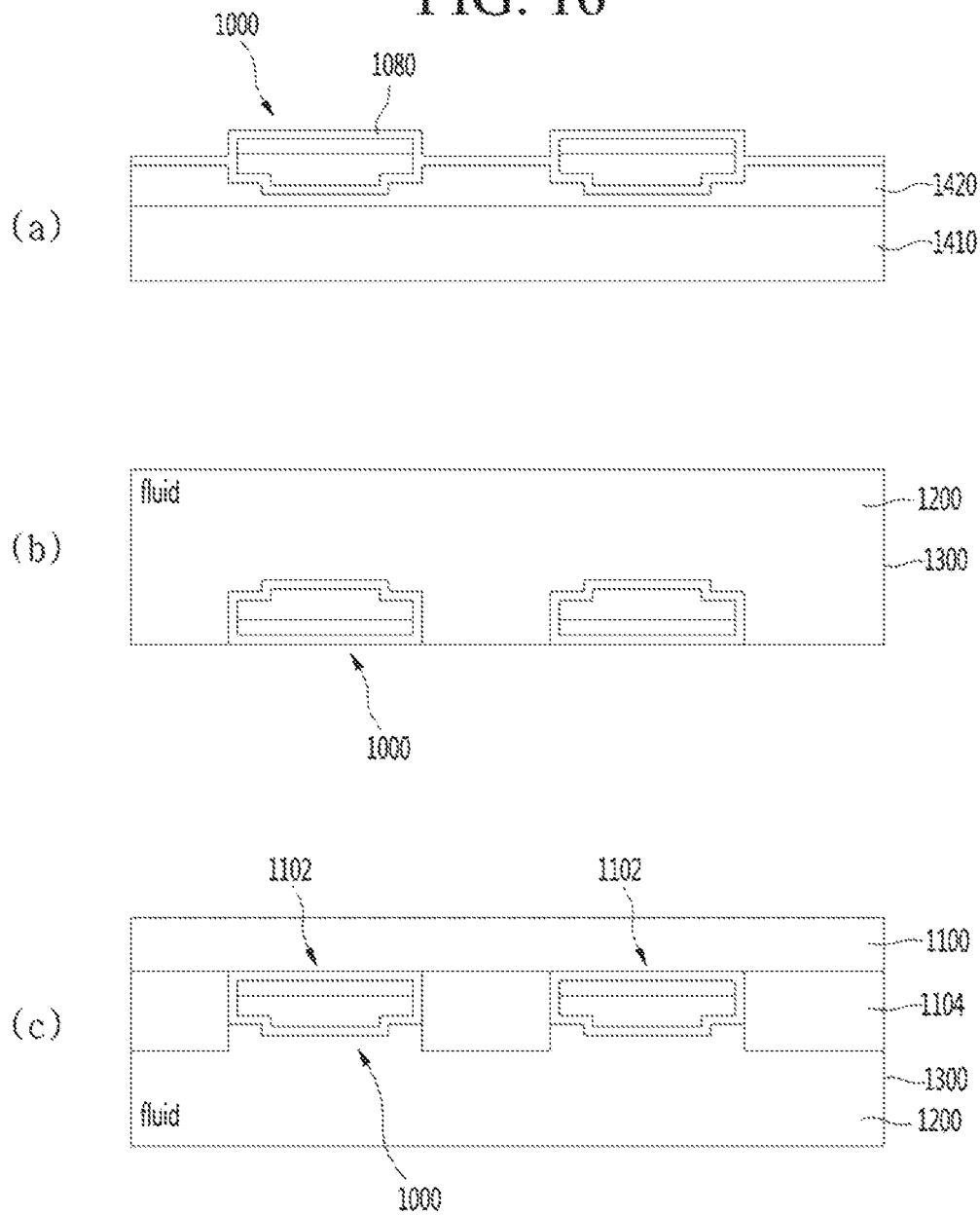

SEMICONDUCTOR LIGHT EMITTING ELEMENT WITH MAGNETIC LAYER, MANUFACTURING METHOD THEREOF, AND DISPLAY DEVICE INCLUDING THE SAME

CROSS-REFERENCE TO RELATED APPLICATIONS

This application is a Continuation of U.S. patent application Ser. No. 16/691,113, filed on Nov. 21, 2019, which claims priority under 35 U.S.C. § 119 to Korean Patent Application No. 10-2019-0013019, filed on Jan. 31, 2019 in the Korean Intellectual Property Office, the entire contents of all these applications are incorporated by reference into the present application.

BACKGROUND

Field

The present disclosure relates to a semiconductor light emitting element and a manufacturing method thereof, and a display device including the semiconductor light emitting element.

Discussion of the Background Art

Recently, displays having excellent characteristics such as a thin shape and flexibility have been developed in the display technology field. On the other hand, an LCD (Liquid Crystal Display) and AMOLED (Active Matrix Organic Light Emitting Diodes) are representative of main displays that are commonly used now.

However, the LCD has a problem that a response time is not short and it is difficult to implement flexibility and AMOLED has a defect that the lifespan is short and the yield is not good.

Meanwhile, a light emitting diode (LED), which is a well-known semiconductor light emitting element that converts a current into light, has been used as a light source for displaying images in electronic devices including information devices together with a green LED based on GaP:N since a red LED using a GaAsP compound semiconductor was commercialized in 1962. Accordingly, a plan that solves the problems by implementing a display using the semiconductor light emitting element may be proposed. Such an LED has the advantage of a long lifespan, low power consumption, an excellent initial driving characteristic, high vibration resistance, etc, as compared with a filament-based light emitting element.

Meanwhile, according to a display that uses semiconductor light emitting elements, it is required to couple semiconductor light emitting elements respectively corresponding to pixels to a substrate, so it may be relatively difficult to implement a display having a large screen and many pixels. Accordingly, recently, a manufacturing method that couples semiconductor light emitting elements to a substrate in a self-assembling type that uses an electromagnetic field is being developed.

In this case, a magnetic layer including a magnetic material may be formed in the semiconductor light emitting elements. In the related art, a magnetic layer is additionally inserted when a N-type electrode (or a P-type electrode) is formed in a semiconductor light emitting element. However, since a magnetic layer has low reflectance, it may cause a problem of deterioration of optical extraction efficiency when a semiconductor light emitting element emits light.

SUMMARY OF THE DISCLOSURE

An object of the present disclosure is to provide a structure that can maximize optical extraction efficiency of a semiconductor light emitting element having a magnetic layer, and a method of manufacturing the semiconductor light emitting element.

A semiconductor light emitting element according to an embodiment of the present disclosure includes: a n-type semiconductor layer; a p-type semiconductor layer formed in a first region on the n-type semiconductor layer; a p-type electrode formed on the p-type semiconductor layer; a n-type electrode formed in a second region different from the first region on the n-type semiconductor layer; and a magnetic layer formed under the n-type semiconductor layer.

The semiconductor light emitting element may further include a reflective layer formed between the n-type semiconductor layer and the magnetic layer.

Depending on embodiments, contact surfaces of the n-type semiconductor layer and the reflective layer may be formed as non-planar surfaces.

Depending on embodiments, the semiconductor light emitting element may further include a first adhesive member formed between the n-type semiconductor layer and the reflective layer and a second adhesive member formed between the reflective layer and the magnetic layer. The first adhesive member and the second adhesive member may be made of at least one of chromium or titanium.

Depending on embodiments, the p-type electrode may be implemented as a transparent electrode and the n-type electrode may be made of metal.

Depending on embodiments, the semiconductor light emitting element may further include an assistant reflective layer formed between the n-type electrode and the n-type semiconductor layer.

Depending on embodiments, the semiconductor light emitting element may further include a passivation layer surrounding the n-type semiconductor layer, the p-type semiconductor layer, the p-type electrode, the n-type electrode, and the magnetic layer.

A method of manufacturing semiconductor light emitting element according to an embodiment of the present disclosure may include: forming a semiconductor light emitting element, which includes a n-type semiconductor layer having one surface being in contact with a growth substrate, a p-type semiconductor layer growing on the n-type semiconductor layer, a p-type electrode electrically connected with the p-type semiconductor layer, and a n-type electrode electrically connected with the n-type semiconductor layer, on the growth substrate; separating the semiconductor light emitting element from the growth substrate, and fixing the semiconductor light emitting element to a temporary substrate in a flipped state such that the one surface of the n-type semiconductor layer faces up; and forming a magnetic layer on the one surface of the n-type semiconductor layer.

Depending on embodiments, the forming of a magnetic layer on the one surface of the n-type semiconductor layer may include: forming a reflective layer on the one surface; and forming the magnetic layer on the reflective layer.

Depending on embodiments, the forming of a reflective layer may include: etching the n-type semiconductor layer at a predetermined height; and forming the reflective layer on the etched n-type semiconductor layer, and contact surfaces of the n-type semiconductor layer and the reflective layer may be formed as non-planar surfaces.

Depending on embodiments, the etching of the n-type semiconductor layer at a predetermined height may include: applying a photoresist to the semiconductor light emitting element; exposing the n-type semiconductor layer by removing the photoresist in a region corresponding to the n-type semiconductor layer; and etching the exposed n-type semiconductor layer at a predetermined height.

Depending on embodiments, the forming of a semiconductor light emitting element may further include forming a passivation layer surrounding the semiconductor light emitting element except for the one surface of the n-type semiconductor layer.

Depending on embodiments, the method may further include forming a passivation layer on the magnetic layer.

BRIEF DESCRIPTION OF DRAWINGS

FIGS. 14 to 16 are diagrams for describing a method of manufacturing the semiconductor light emitting element according to the embodiment of FIG. 11.

DETAILED DESCRIPTION OF THE EMBODIMENTS

Figure 1:
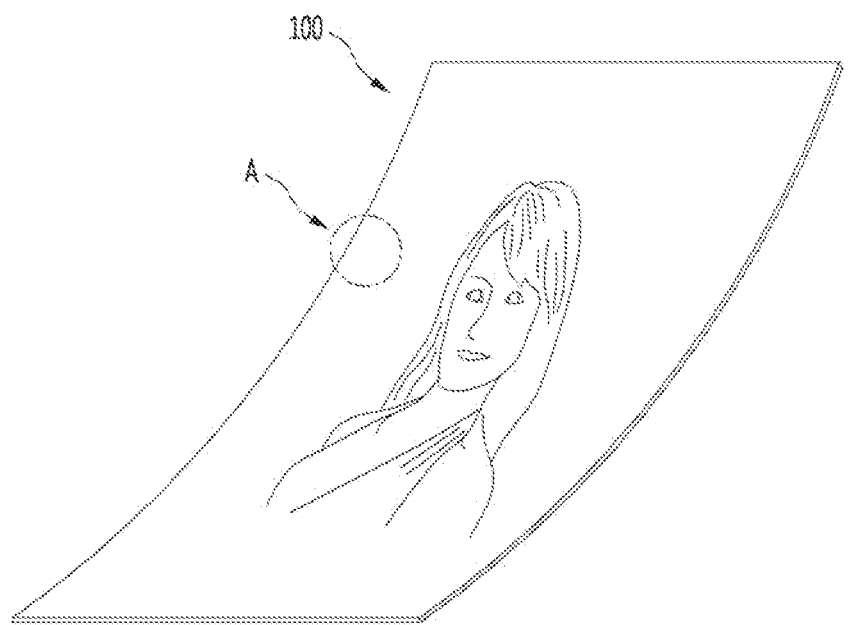
FIG. 1 is a conceptual view showing an embodiment of a display using a semiconductor light emitting element of the present disclosure.

Hereafter, embodiments of the present disclosure will be described in detail with reference to the accompanying drawings and the same or similar components are given the same reference numerals regardless of the numbers of figures and are not repeatedly described. Terms "module" and "unit" that are used for components in the following description are used only for the convenience of description without having discriminate meanings or functions. In the following description, if it is decided that the detailed description of known technologies related to the present disclosure makes the subject matter of the embodiments described herein unclear, the detailed description is omitted. Further, it should be noted that the accompanying drawings are provided only for easy understanding of the embodiments disclosed herein and the spirit of the present disclosure should not be construed as being limited to the accompanying drawings.

When an element such as a layer, a region, or a substrate is referred to as being "on," another element, it may be directly on the other element, or an intervening element may be present therebetween.

A display described herein may include a mobile phone, a smart phone, a laptop computer, a digital broadcasting terminal, a PDA (personal digital assistants), a PMP (portable multimedia player), a navigation, a slate PC, a tablet PC, a ultra book, a digital TV, a desktop computer, etc. However, it would be easily understood by those skilled in the art that the configuration according to embodiments described here may be applied to devices that can be equipped with a display, even if the devices are new types of products that will be developed in future.

Before an assembly apparatus for assembling a semiconductor light emitting element to a display panel (substrate) according to an embodiment of the present disclosure is described, a semiconductor light emitting element and a display using the semiconductor light emitting element are described.

FIG. 1 is a conceptual diagram showing an embodiment of a display using a semiconductor light emitting element of the present disclosure.

Referring to the figure, information that is processed by a controller of a display 100 can be displayed using a flexible display.

The flexible display includes displays that can be bent, curved, twisted, folded, and rolled by external force. For example, the flexible display may be a display that is manufactured on a thin and flexible substrate, which can be bent, curved, folded, or rolled like paper, while maintaining the display characteristics of existing flat panel display.

In a state in which the flexible display is not bent (e.g., in which the flexible display has an infinite radius of curvature, which is referred to as a 'first state' hereafter), the display region of the flexible display becomes a flat surface. In a state in which the flexible display is bent from the first state by external force (e.g., in which the flexible display has a finite radius of curvature, which is referred to as a 'second state' hereafter), the display region may be a curved surface. As shown in the figure, the information that is displayed in the second state may be visual information that is output on the curved surface. Such visual information is implemented by individual control of light emission of sub-pixels disposed in a matrix type. The sub-pixel means a minimum unit for implementing one color.

The sub-pixels of the flexible display can be implemented by a semiconductor light emitting element. A light emitting diode (LED) that is a kind of semiconductor light emitting element converting a current into light is exemplified in the present disclosure. The light emitting diode is formed in a small size, so it can function as a sub-pixel even in the second state.

Hereafter, a flexible display implemented using the light emitting diode is described in more detail with reference to drawings.

Figure 2:
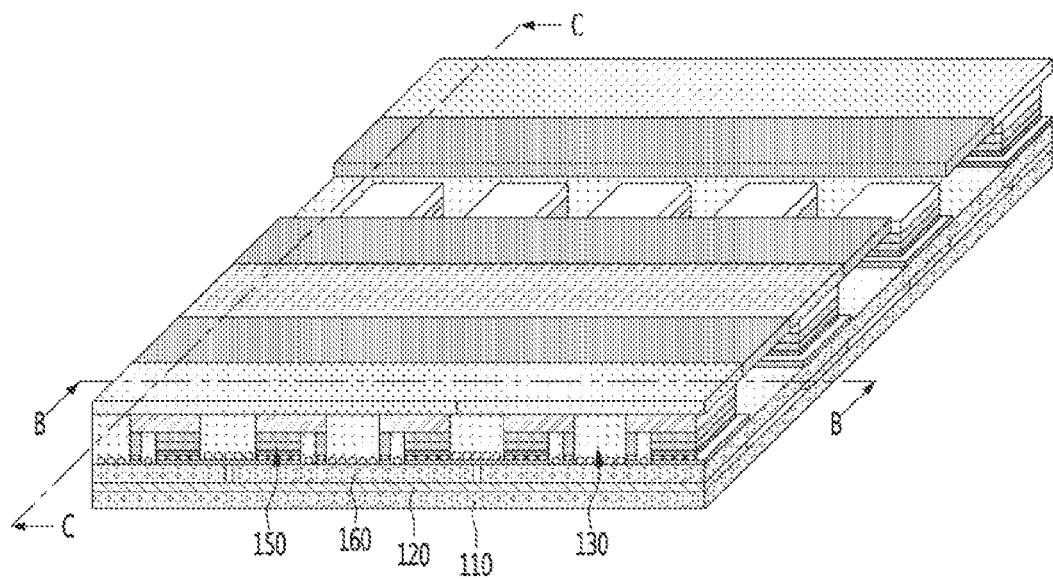
FIG. 2 is a partial enlarged view of the part A of FIG. 1 and FIGS. 3A and 3B are cross-sectional views taken along line B-B and C-C of FIG. 2.
Figure 3A:
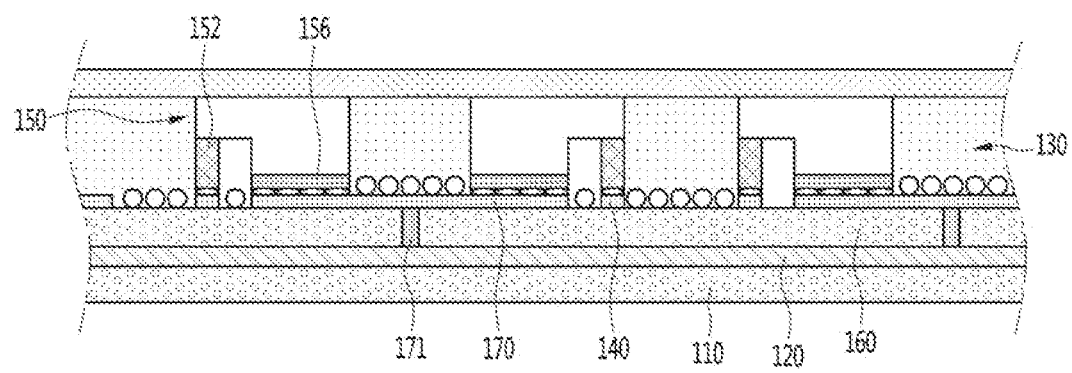
Figure 3B:
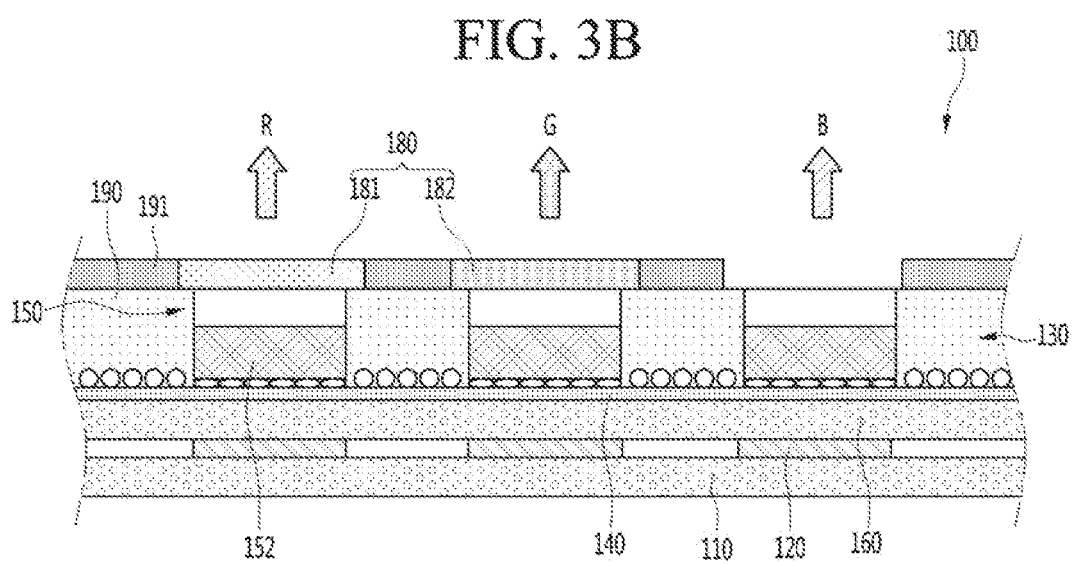
Figure 4:
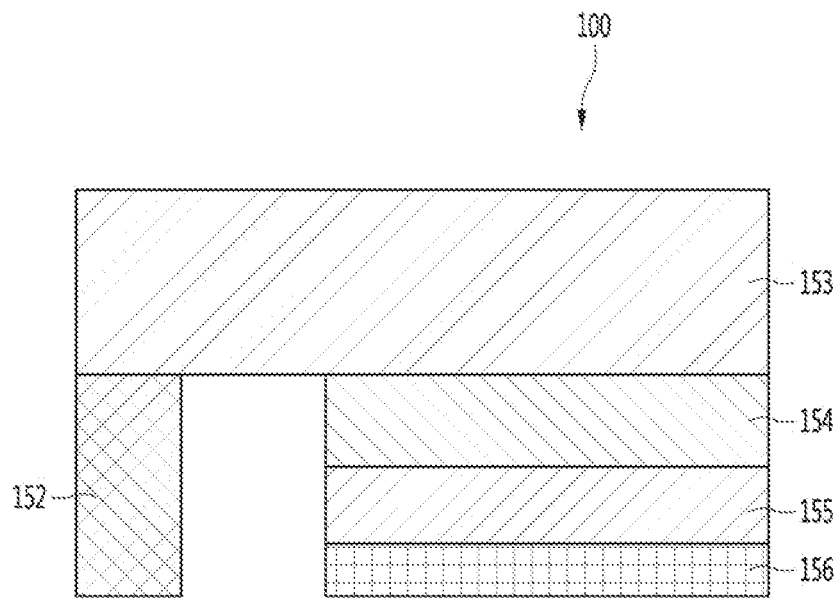
FIG. 4 is a conceptual view showing a flip-chip type semiconductor light emitting element of FIG. 3.

FIG. 2 is a partial enlarged view of the portion A of FIG. 1, FIGS. 3A and 3B are cross-sectional views taken along lines B-B and C-C of FIG. 2, FIG. 4 is a conceptual view showing a flip-chip type semiconductor light emitting element of FIG. 3A, and FIGS. 5A to 5C are conceptual views showing various types that implement colors in relation to a flip-chip type semiconductor light emitting element.

According to FIGS. 2, 3A, and 3B, as a display 100 using a semiconductor light emitting element, a display 100 using a passive matrix (PM) type of semiconductor light emitting element is exemplified. However, examples to be described hereafter can be applied also to an active matrix (AM) type of semiconductor light emitting element.

The display 100 includes a first substrate 110, a first electrode 120, a conductive adhesive layer 130, a second electrode 140, and a plurality of semiconductor light emitting elements 150.

The substrate 110 may be a flexible substrate. For example, the substrate 110 may include glass or polyimide (PI) to implement a flexible display. Further, any materials may be used as long as they have insulation and flexibility such as PEN (Polyethylene Naphthalate) and PET (Polyethylene Terephthalate). Further, the substrate 110 may be made of any one of a transparent material or an opaque material.

The substrate 110 may be a wiring board on which the first electrode 120 is disposed, so the first electrode 120 may be positioned on the substrate 110.

According to the drawings, an insulating layer 160 may be disposed over the substrate 110 on which the first electrode 120 is positioned, and an auxiliary electrode 170 may be positioned on the insulating layer 160. In this case, the state in which the insulating layer 160 is stacked on the substrate 110 may be one wiring board. In more detail, the insulating layer 160 may be made of an insulating and flexible material, such as PI (Polyimide), PET, and PEN, integrally with the substrate 110, thereby forming one substrate.

The auxiliary electrode 170, which is an electrode electrically connecting the semiconductor light emitting elements 150, is positioned on the insulating layer 160 and disposed to correspond to the first electrode 120. For example, the auxiliary electrode 170 has a dot shape and can be electrically connected with the first electrode 120 by electrode holes 171 formed through the insulating layer 160. The electrode hole 171 may be formed by filing a via hole with a conductive material.

Referring to the figures, the conductive adhesive layer 130 is formed on a surface of the insulating layer 160, but the present disclosure is not necessarily limited thereto. For example, a structure, in which a layer performing a specific function is formed between the insulating layer 160 and the conductive adhesive layer 130 or the conductive adhesive layer 130 is disposed on the substrate 110 without the insulating layer 160, is possible. In the structure in which the conductive adhesive layer 130 is disposed on the substrate 110, the conductive adhesive layer 130 can function as an insulating layer.

The conductive adhesive layer 130 may be a layer having an adhesive property and conductivity, and to this end, a substance having conductivity and a substance having an adhesive property may be mixed in the conductive adhesive layer 130. Further, the conductive adhesive layer 130 has ductility, so it enables the flexible function of the display.

As an example of this case, the conductive adhesive layer 130 may be an anisotropy conductive film (ACF), an anisotropy conductive paste, and a solution containing conductive particles. The conductive adhesive layer 130 may be configured as a layer that allows for electrical connection in a Z direction passing through the thickness, but has electrical insulation in the horizontal X-Y direction. Accordingly, the conductive adhesive layer 130 may be referred to as a Z-axial conductive layer (however, hereafter, referred to as a 'conductive adhesive layer').

The anisotropic conductive film is a film in which an anisotropic conductive medium is mixed in an insulating base member, and only a specific portion is given conductivity by the anisotropic conductive medium when heat and pressure are applied. It is assumed in the following description that heat and pressure are applied to the anisotropic conductive film, but other methods are also possible so that the anisotropic conductive film partially has conductivity. These methods, for example, may be a case of applying only any one of heat and pressure or a case of UV curing.

Further, the anisotropic conductive medium, for example, may be a conductive ball or a conductive particle. According to the figures, in this embodiment, the anisotropic conductive film is a film in which conductive balls are mixed in an insulating base member, and only a specific portion is given conductivity by the conductive balls when heat and pressure are applied. The anisotropic conductive film may be in a state in which a plurality of particles coated with an insulating film made of a polymer material is contained in a core made of a conductive substance, and in this case, when heat and pressure are applied a portion, the insulating film is broken at the portion and the portion is given conductivity by the core. In this case, the shape of the core is deformed, so layers that are in contact with each other in the thickness direction of the film may be formed. As a more detailed example, heat and pressure are applied throughout the anisotropic conductive film and Z-axial electrical connection is partially formed by the height difference of an object that is bonded by the anisotropic conductive film.

As another example, the anisotropic conductive film may be in a state in which a plurality of particles coated with a conductive substance is contained in an insulating core. In this case, when heat and pressure are applied to a portion, the conductive substance at the portion is deformed (gets scored and sticks), so the portion is given conductivity in the thickness direction of the film. As another example, the conductive substance may pass through the insulating base member in the Z-axial direction to show conductivity in the thickness direction of the film. In this case, the conductive substance may have a pointed end.

According to the figures, the anisotropic conductive film may be a fixed array ACF in which conductive balls are inserted in a surface of an insulating base member. In more detail, the insulating base member is made of an adhesive substance, the conductive balls are concentrated at the bottom of the insulating base member, and when heat and pressure are applied to the base member, the base member is deformed with the conductive balls, thereby being given vertical conductivity.

However, the present disclosure is not limited thereto, and the anisotropic conductive film may be configured in a type in which conductive balls are randomly mixed in an insulating base member or a type in which a plurality of layers is provided and conductive balls are disposed in any one layer (double-ACF).

The anisotropic conductive paste is formed by combining a paste and conductive balls, and may be a paste in which conductive balls are mixed in an insulating and adhesive base substance. Further, the solution containing conductive particles may be a solution containing conductive particles or nano particles.

Referring to figures again, the second electrode 140 is spaced apart from the auxiliary electrode 170 and positioned on the insulating layer 160. That is, the conductive adhesive layer 130 is disposed on the insulating layer 160 on which the auxiliary electrode 170 and the second electrode 140 are positioned.

When the conductive adhesive layer 130 is formed in a state in which the auxiliary electrode 170 and the second electrode 140 are positioned on the insulating layer 160, and then the semiconductor light emitting element 150 is connected in a flip-chip type by applying heat and pressure, the semiconductor light emitting element 150 is electrically connected with the first electrode 120 and the second electrode 140.

Referring to FIG. 4, the semiconductor light emitting element may be a flip-chip type light emitting element.

For example, the semiconductor light emitting element includes a p-type electrode 156, a p-type semiconductor layer 155 on which the p-type electrode 156 is formed, an active layer 154 formed on the p-type semiconductor layer 155, a n-type semiconductor layer 153 formed on the active layer 154, and a n-type electrode 152 horizontally spaced apart from the p-type electrode 156 on the n-type semiconductor layer 153. In this case, the p-type electrode 156 can be electrically connected with the auxiliary electrode 170 by the conductive adhesive layer 130, and the n-type electrode 152 can be electrically connected with the second electrode 140.

Referring to FIGS. 2, 3A, and 3B again, the auxiliary electrode 170 is elongated in one direction and at least one auxiliary electrode can be electrically connected with a plurality of semiconductor light emitting elements 150. For example, the p-type electrodes of semiconductor light emitting elements at left and right sides from an auxiliary electrode can be electrically connected with one auxiliary electrode.

In more detail, the semiconductor light emitting element 150 is pressed into the conductive adhesive layer 130 by heat and pressure, so only the portion between the p-type electrode 156 of the semiconductor light emitting element 150 and the auxiliary electrode 170 and the portion between the n-type electrode 152 of the semiconductor light emitting element 150 and the second electrode 140 have conductivity, and the other portions do not have conductivity because the semiconductor light emitting element is pressed inside. As described above, the conductive adhesive layer 130 not only couples, but also electrically connects the portion between the semiconductor light emitting element 150 and the auxiliary electrode 170 and the portion between the semiconductor light emitting element 150 and the second electrode 140.

Further, the plurality of semiconductor light emitting elements 150 constitutes a light emitting element array, and a fluorescent layer 180 is formed on the light emitting element array.

The light emitting element array may include a plurality of semiconductor light emitting elements having different own luminance values. Each of the semiconductor light emitting element 150 constitutes a sub-pixel and is electrically connected to the first electrode 120. For example, the first electrode 120 may be a plurality of pieces, the semiconductor light emitting elements, for example, may be arranged in several lines, and the semiconductor light emitting elements in each line may be electrically connected to any one of the plurality of first electrodes.

Further, since the semiconductor light emitting elements are connected in a flip-chip type, it is possible to use grown semiconductor light emitting elements for a transparent dielectric substrate. Further, the semiconductor light emitting elements, for example, may be nitride semiconductor light emitting elements. Since the semiconductor light emitting element 150 has excellent luminance, it can constitute an individual sub-pixel even in a small size.

According to the figures, a separation wall 190 may be formed between the semiconductor light emitting elements 150. In this case, the separation wall 190 can serve to separate individual sub-pixels and may be formed integrally with the conductive adhesive layer 130. For example, the semiconductor light emitting elements 150 are inserted in the anisotropic conductive film, the base member of the anisotropic conductive film can form the separation wall.

Further, when the base member of the anisotropic conductive film is black, the separation wall 190 can have a reflective characteristic and the contrast can be increased even without a discrete black insulator.

As another example, a reflective separation wall may be provided as the separation wall 190. In this case, the separation wall 190 may include a black or white insulator, depending on the object of the display. When a separation wall of a white insulator is used, there can be an effect of increasing reflectivity, and when a separation wall of a black insulator, it is possible to have a reflective characteristic and increase contrast.

The fluorescent layer 180 may be positioned on the outer side of the semiconductor light emitting element 150. For example, the semiconductor light emitting element 150 is a blue semiconductor light emitting element that emits blue light (B), and the fluorescent layer 180 performs a function of converting the blue light (B) into a color of a sub-pixel. The fluorescent layer 180 may be a red fluorescent body 181 or a green fluorescent body 182 that constitutes an individual pixel.

That is, the red fluorescent body 181 that can convert blue light into red light (R) may be stacked on a blue semiconductor light emitting element at a position where a red sub-pixel is formed, and the green fluorescent body 182 that can convert blue light into green light (G) may be stacked on a blue semiconductor light emitting element at a position where a green sub-pixel is formed. Further, only a blue semiconductor light emitting element may be independently used a portion forming a blue sub-pixel. In this case, red (R), green (G), and blue (B) sub-pixels can form one pixel. In more detail, a fluorescent body having one color may be stacked along each line of the first electrode 120. Accordingly, in the first electrode 120, one line may be an electrode that controls one color. That is, red (R), green (G), and blue (B) may be sequentially disposed along the second electrode 140, whereby a sub-pixel can be implemented.

However, the present disclosure is not necessarily limited thereto, and red (R), green (G), and blue (B) sub-pixels may be implemented by combining the semiconductor light emitting element 150 and a quantum dot (QD) instead of a fluorescent body.

Further, a black matrix 191 may be disposed between each of fluorescent bodies to improve contrast. That is, the black matrix 191 can improve the contrast of light and darkness.

However, the present disclosure is not necessarily limited thereto and another structure may be applied to implement blue, red, and green.

Figure 5A:
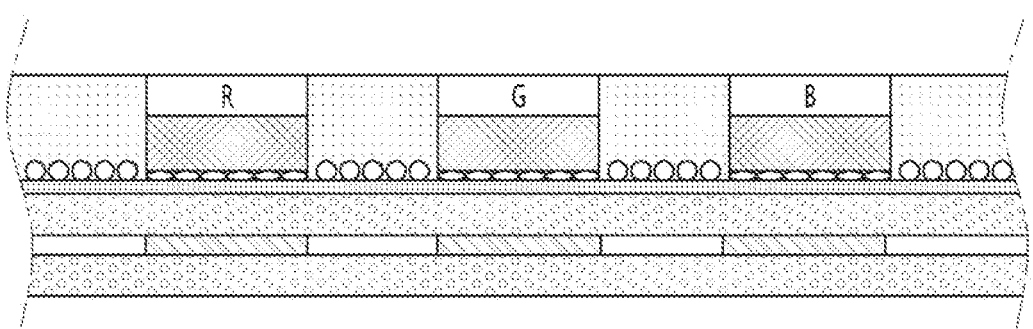
FIGS. 5A to 5C are conceptual views showing various types that implement colors in relation to a flip-chip type semiconductor light emitting element.

Referring to FIG. 5A, the semiconductor light emitting elements 150 each may be implemented as a high-power light emitting elements in which gallium nitride (GaN) is included as a main component and indium (In) and/or aluminum (Al) is added to emit various colors of light including blue.

In this case, the semiconductor light emitting elements 150 may be red, green, and blue semiconductor light emitting elements to from sub-pixels respectively. For example, red, green, and blue semiconductor light emitting elements (R, G, B) are alternately disposed, and sub-pixels of red, green, and blue constitute one pixel by the red, green, and blue semiconductor light emitting elements, whereby a full-color display can be implemented.

Figure 5B:
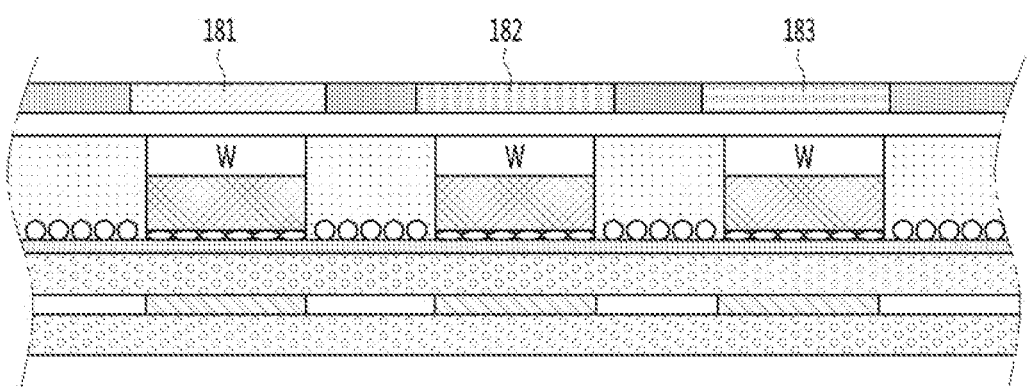

Referring to FIG. 5B, the semiconductor light emitting element may have white light emitting elements (W) each having a yellow fluorescent layer. In this case, in order to form a sub-pixel, a red fluorescent layer 181, a green fluorescent layer 182, and a blue fluorescent layer 183 may be disposed on the white light emitting element (W). Further, a sub-pixel may be formed using a color filter in which red, green, and blue are repeated, on the white light emitting element (W).

Figure 5C:
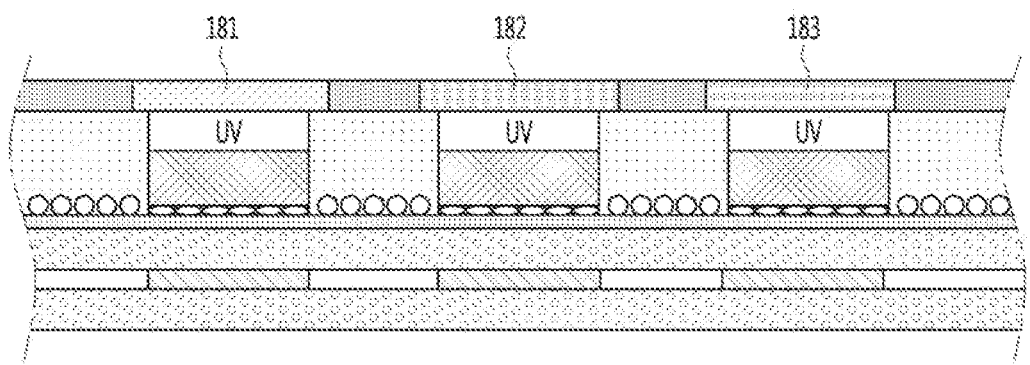

Referring to FIG. 5C, a structure in which a red fluorescent layer 181, a green fluorescent layer 182, and a blue fluorescent layer 183 are disposed on an ultraviolet light emitting element (UV) may be possible. As described above, a semiconductor light emitting element can be used in the entire region including not only the visual light, but also ultraviolet light (UV), and can be expanded in the type of a semiconductor light emitting element that can use ultraviolet light (UV) as an excitation source of an upper fluorescent body.

Referring to this embodiment again, the semiconductor light emitting element 150 is positioned on the conductive adhesive layer 130, thereby constituting a sub-pixel in the display. Since the semiconductor light emitting element 150 has excellent luminance, it can constitute an individual sub-pixel even in a small size. The individual semiconductor light emitting element 150 may have a size with one side of 80 μm or less and may be a rectangular or a square device. When it is a rectangle, the size may be 20×80 μm or less.

Further, even using a square semiconductor light emitting element 150 having one side length of 10 μm as a sub-pixel, sufficient brightness for forming a display is shown. Accordingly, for example, in a case in which the size of a sub-pixel is a rectangular pixel having one side of 600 μm and the other one side of 300 μm, the distance of a semiconductor light emitting element is relatively sufficiently large. Accordingly, in this case, it is possible to implement a flexible display having high quality over HD quality.

The display using the semiconductor light emitting element described above can be manufactured by a new type of manufacturing method. Hereafter, this manufacturing method is described with reference to FIG. 6.

Figure 6:
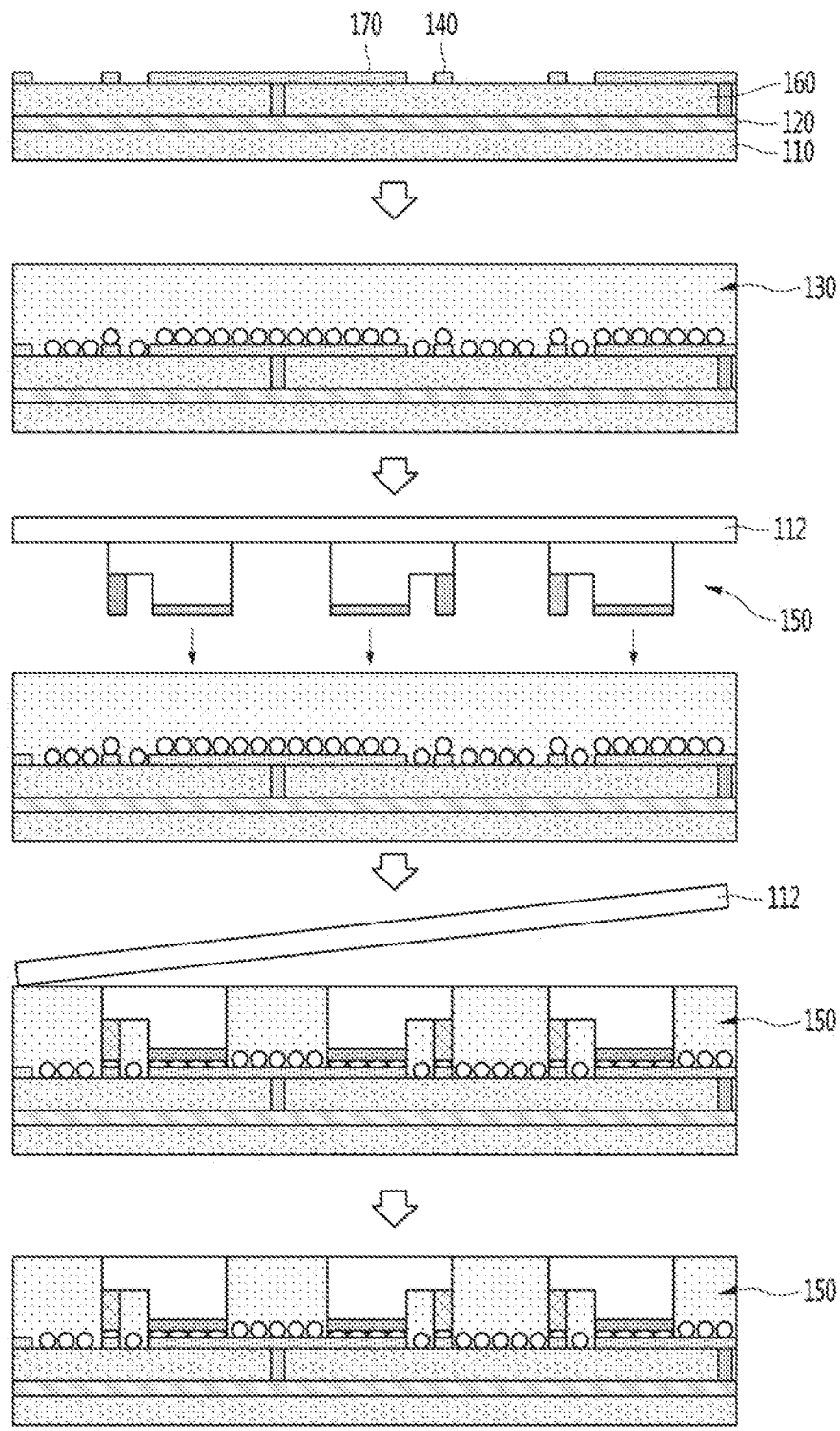
FIG. 6 shows cross-sectional views illustrating a method of manufacturing a display using a semiconductor light emitting element of the present disclosure.

FIG. 6 shows cross-sectional views illustrating a method of manufacturing a display using a semiconductor light emitting element of the present disclosure.

Referring to this figure, first, the conductive adhesive layer 130 is formed on the insulating layer 160 on which the auxiliary electrode 170 and the second electrode 140 are positioned. The insulating layer 160 is stacked on the first substrate 110, thereby forming one substrate (wiring board). Further, the first electrode 120, the auxiliary electrode 170, and the second electrode 140 are disposed on the wiring board. In this case, the first electrode 120 and the second electrode 140 may be disposed perpendicular to each other. Further, in order to implement a flexible display, the first substrate 110 and the insulating layer 160 each may include glass or polyimide (PI).

The conductive adhesive layer 130, for example, may be implemented by an anisotropic conductive film, and to this end, an anisotropic conductive film may be applied to a substrate on which the insulating layer 160 is positioned.

Next, a second substrate 112 on which a plurality of semiconductor light emitting elements 150, which correspond to the positions of the auxiliary electrodes 170 and the second electrodes 140 and constitute individual pixels, is positioned is disposed such that the semiconductor light emitting elements 150 face the auxiliary electrodes 170 and the second electrodes 140.

In this case, the second substrate 112, which is a growing substrate for growing the semiconductor light emitting elements 150, may be a spire substrate or a silicon substrate.

The semiconductor light emitting elements have a gap and a size that can form a display when they are formed in a wafer unit, so they can be effectively used for a display.

Next, the wiring board and the second substrate 112 are thermally pressed. For example, the wiring board and the second substrate 112 can be thermally pressed using an ACF press head. The wiring board and the second substrate 112 are bonded by the thermal pressing. Only the portions among the semiconductor light emitting element 150, the auxiliary electrode 170, and the second electrode 140 have conductivity by the characteristics of an anisotropic conductive film having conductivity by thermal pressing, so the electrodes and the semiconductor light emitting elements 150 can be electrically connected. In this case, the semiconductor light emitting elements 150 are inserted in the anisotropic conductive film, so separation walls may be formed between the semiconductor light emitting elements 150.

Next, the second substrate 112 is removed. For example, it is possible to remove the second substrate 112 using Laser Lift-off (LLO) or Chemical Lift-off (CLO).

Finally, the semiconductor light emitting elements 150 are exposed to the outside by removing the second substrate 112. If necessary, it is possible to form a transparent insulating layer (not shown) by coating the top of the wiring board, to which the semiconductor light emitting elements 150 are coupled, with silicon oxide (SiOx), etc.

Further, a step of forming a fluorescent layer on a surface of the semiconductor light emitting element 150 may be further included. For example, the semiconductor light emitting element 150 may be a blue semiconductor light emitting element that emits blue light (B), and a red fluorescent body or a green fluorescent body for converting the blue light (B) into the light of a sub-pixel may form a layer on a surface of the blue semiconductor light emitting element.

The manufacturing method or structure of the display using a semiconductor light emitting element described above can be modified in various ways. As an example, a vertical semiconductor light emitting element can also be applied to the display described above. Hereafter, a vertical structure is described with reference to FIGS. 5 and 6.

Further, in the modification or embodiment to be described hereafter, the same or similar components are given the same or similar reference numerals, and the above description is referred to for the description.

Figure 7:
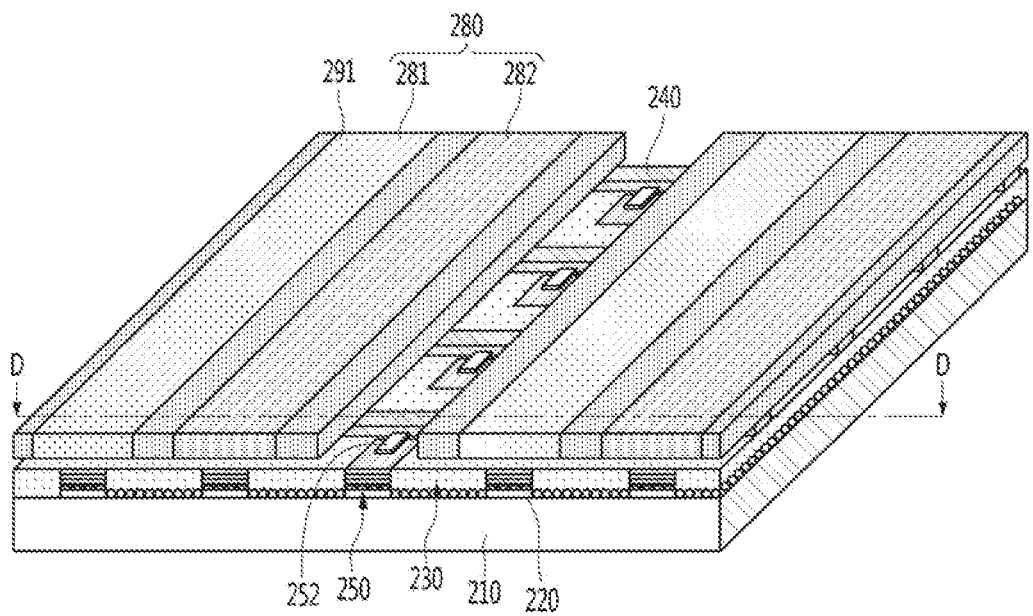
FIG. 7 is a perspective view showing another embodiment of a display using a semiconductor light emitting element of the present disclosure.
Figure 8:
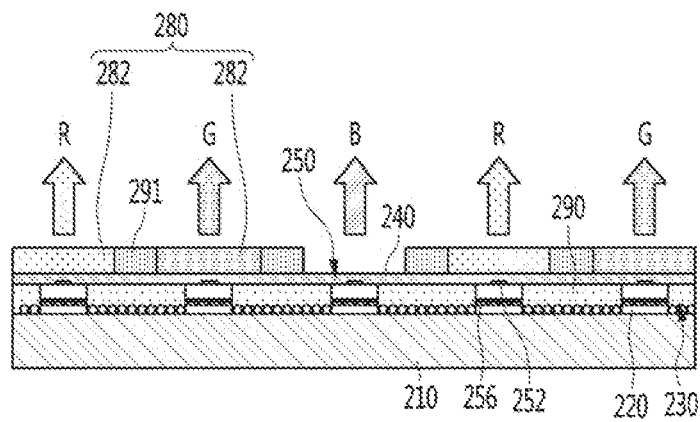
FIG. 8 is a cross-sectional view taken along line D-D of FIG. 7.
Figure 9:
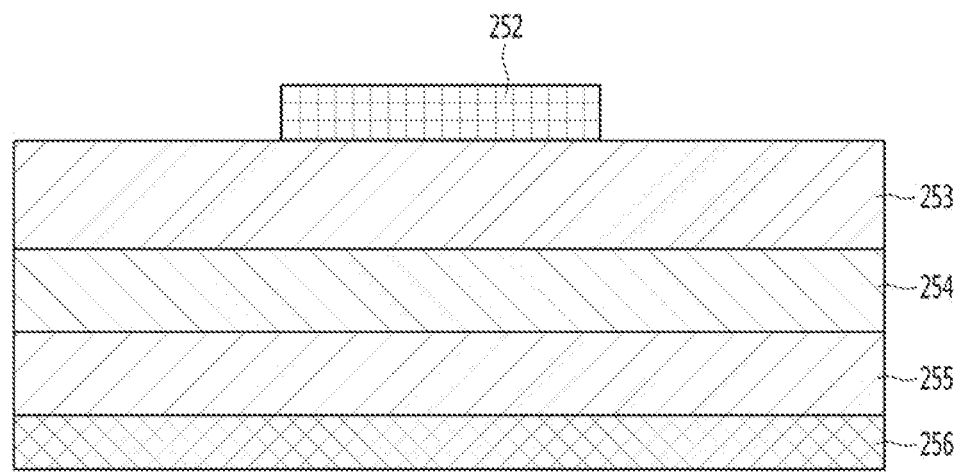
FIG. 9 is a conceptual view showing a vertical semiconductor light emitting element of FIG. 8.

FIG. 7 is a perspective view showing another embodiment of a display using a semiconductor light emitting element of the present disclosure, FIG. 8 is a cross-sectional view taken along line D-D of FIG. 7, and FIG. 9 is a conceptual view showing a vertical semiconductor light emitting element of FIG. 8.

Referring to these figures, the display may be a display that uses passive matrix (PM) type of vertical semiconductor light emitting elements.

The display includes a substrate 210, a first electrode 220, a conductive adhesive layer 230, a second electrode 240, and a plurality of semiconductor light emitting elements 250.

The substrate 210, which is a wiring board on which the first electrode 220 is disposed, may include polyimide (PI) to implement a flexible display. Further, any materials may be used as long as they have insulation and flexibility.

The first electrode 220 is positioned on the substrate 210 and may be formed in a bar shape that is long in one direction. The first electrode 220 may be configured to function as a data electrode.

The conductive adhesive layer 230 is formed on the substrate 210 on which the first electrode 220 is positioned. Like a display to which flip-chip type light emitting elements are applied, the conductive adhesive layer 230 may be an anisotropy conductive film (ACF), an anisotropy conductive paste, and a solution including conductive particles. However, in this embodiment, a case in which the conductive adhesive layer 230 is implemented by an anisotropic conductive film is exemplified.

An isotropic conductive film is positioned in a state in which the first electrode 220 is positioned on the substrate 210 and then the semiconductor light emitting element 250 is connected by applying heat and pressure, the semiconductor light emitting element 250 is electrically connected with the first electrode 220. In this case, it is preferable that the semiconductor light emitting element 250 is disposed to be positioned on the first electrode 220.

The electrical connection, as described above, is generated because when heat and pressure are applied, the anisotropic conductive film partially has conductivity in the thickness direction. Accordingly, the anisotropic conductive film is divided into a portion having conductivity in the thickness direction and a portion not having conductivity in the thickness direction.

Further, since the anisotropic conductive film contains an adhesive component, the conductive adhesive layer 230 implements not only electrical connection, but also mechanical coupling between the semiconductor light emitting element 250 and the first electrode 220.

As described above, the semiconductor light emitting element 250 is positioned on the conductive adhesive layer 230, whereby it configures an individual pixel in the display. Since the semiconductor light emitting element 250 has excellent luminance, it can constitute an individual sub-pixel even in a small size. The individual semiconductor light emitting element 250 may have a size with one side of 80 μm or less and may be a rectangular or a square device. When it is a rectangle, the size may be 20×80 μm or less.

The semiconductor light emitting element 250 may be a vertical structure.

A plurality of second electrodes 240 disposed across the length direction of the first electrode 220 and electrically connected with the vertical semiconductor light emitting elements 250 is positioned between the vertical semiconductor light emitting elements.

Referring to FIG. 9, the vertical semiconductor light emitting elements include a p-type electrode 256, a p-type semiconductor layer 255 formed on the p-type electrode 256, an active layer 254 formed on the p-type semiconductor layer 255, a n-type semiconductor layer 253 formed on the active layer 254, and a n-type electrode 252 formed on the n-type semiconductor layer 253. In this case, the p-type electrode 256 positioned at a lower portion can be electrically connected with the first electrode 220 by the conductive adhesive layer 230, and the n-type electrode 252 positioned at an upper portion can be electrically connected with the second electrode 240 to be described below. The semiconductor light emitting element 250 has a large advantage in that electrodes can be disposed up and down, so the chip size can be reduced.

Referring to FIG. 8 again, a fluorescent layer 280 may be formed on a surface of the semiconductor light emitting element 250. For example, the semiconductor light emitting element 250 is a blue semiconductor light emitting element 251 that emits blue light (B), and the fluorescent layer 280 for converting the blue light (B) into a color of a sub-pixel can be provided. In this case, the fluorescent layer 280 may be a red fluorescent 281 and a green fluorescent body 282 constituting an individual pixel.

That is, the red fluorescent body 281 that can convert blue light into red light (R) may be stacked on a blue semiconductor light emitting element at a position where a red sub-pixel is formed, and the green fluorescent body 282 that can convert blue light into green light (G) may be stacked on a blue semiconductor light emitting element at a position where a green sub-pixel is formed. Further, only a blue semiconductor light emitting element may be independently used a portion forming a blue sub-pixel. In this case, red (R), green (G), and blue (B) sub-pixels can form one pixel.

However, the present disclosure is not necessarily limited thereto and other structures for implementing blue, green, and red, as described above, in a display to which flip-chip type light emitting elements are applied may be applied.

According to this embodiment, the second electrodes 240 are disposed between the semiconductor light emitting elements 250 and electrically connected with the semiconductor light emitting elements. For example, the semiconductor light emitting elements 250 may be disposed in a plurality of lines and the second electrodes 240 may be positioned between the lines of the semiconductor light emitting elements 250.

Since the distance between the semiconductor light emitting elements 250 that form individual pixels is sufficiently large, the second electrodes 240 can be positioned between the semiconductor light emitting elements 250.

The second electrode 240 may be formed as an electrode in a bar shape that is long in one direction and may be disposed perpendicular to the first electrode.

Further, the second electrode 240 and the semiconductor light emitting element 250 can be electrically connected by a connection electrode protruding from the second electrode 240. In more detail, the connection electrode may be the n-type electrode of the semiconductor light emitting element 250. For example, the n-type electrode is formed as an ohmic electrode for ohmic contact and the second electrode covers at least a portion of the ohmic electrode by printing or depositing. Accordingly, the second electrode 240 and the n-type electrode of the semiconductor light emitting element 250 can be electrically connected.

According to the figures, the second electrode 240 may be positioned on the conductive adhesive layer 230. Depending on cases, a transparent insulating layer (not shown) including silicon oxide (SiOx), etc may be formed on the substrate 210 on which the semiconductor light emitting elements 250 are formed. When the second electrode 240 is positioned after the transparent insulating layer is formed, the second electrode 240 is positioned on the transparent insulating layer. Further, the second electrodes 240 may be formed to be spaced apart from each other on the conductive adhesive layer 230 or the transparent insulating layer.

If a transparent electrode such as ITO (Indium Tin Oxide) is used to position the second electrode 240 on the semiconductor light emitting element 250, there is a problem in that the ITO substance is not bonded well to a semiconductor layer. Accordingly, the present disclosure has the advantage that there is no need for using a transparent electrode such as ITO by positioning the second electrode 240 between the semiconductor light emitting elements 250. Accordingly, it is possible to improve optical extraction efficiency by using a conductive substance, which is bonded well to a n-type semiconductor layer, as a horizontal electrode without being limited to selection of a transparent material.

According to the figures, a separation wall 290 may be positioned between the semiconductor light emitting elements 250. That is, the separation wall 290 may be disposed between the vertical semiconductor light emitting elements 250 to isolate the semiconductor light emitting elements 250 forming individual pixels. In this case, the separation wall 290 can serve to separate individual sub-pixels and may be formed integrally with the conductive adhesive layer 230. For example, the semiconductor light emitting elements 250 are inserted in the anisotropic conductive film, the base member of the anisotropic conductive film can form the separation wall.

Further, when the base member of the anisotropic conductive film is black, the separation wall 290 can have a reflective characteristic and the contrast can be increased even without a discrete black insulator.

As another example, a reflective separation wall may be provided as the separation wall 190. The separation wall 290 may include a black or white insulator, depending on the object of the display.

If the second electrode 240 is positioned directly on the conductive adhesive layer 230 between the semiconductor light emitting elements 250, the separation wall 290 may be positioned between each of the semiconductor light emitting elements 250 and the second electrodes 240. Accordingly, there is an effect that it is possible to configure individual sub-pixels even in a small size using the semiconductor light emitting elements 250, it is possible to position the second electrode 240 between the semiconductor light emitting elements 250 because the distance of the semiconductor light emitting elements 250 is relatively larger, and it is possible to implement a flexible display having HD quality.

Further, according to the figures, a black matrix 291 may be disposed between fluorescent bodies to improve contrast. That is, the black matrix 291 can improve the contrast of light and darkness.

As described above, the semiconductor light emitting element 250 is positioned on the conductive adhesive layer 230, whereby it configures an individual pixel in the display. Since the semiconductor light emitting element 250 has excellent luminance, it can constitute an individual sub-pixel even in a small size. Accordingly, a full-color display in which red (R), green (G), and blue (B) sub-pixels form one pixel by semiconductor light emitting elements can be implemented.

Figure 10:
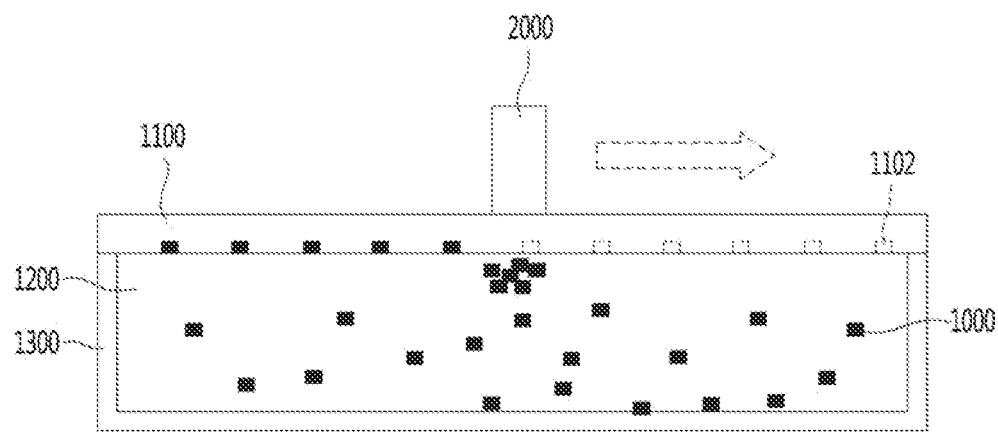
FIG. 10 is a diagram showing an embodiment of a method of assembling a semiconductor light emitting element to a substrate.

FIG. 10 is a diagram showing an embodiment of a method of assembling a semiconductor light emitting element to a substrate.

An example in which a semiconductor light emitting element is assembled to a substrate by a self-assembling type using an electromagnetic field is briefly described with reference to FIG. 10.

Referring to FIG. 10, a semiconductor light emitting element 1000 can be put into a chamber 1300 filled with fluid 1200.

Thereafter, the substrate 1100 can be disposed on the chamber 1300. Depending on embodiments, the substrate 1100 may be put into the chamber 1300.

The coupling holes 1102 to which the semiconductor light emitting elements 1000 are coupled are formed in the substrate 1100 and the surface on which the coupling holes 1102 are formed can come in contact with the fluid 1200. For example, the coupling holes 1102 may mean insulating through-holes formed through an insulating layer formed on a surface of the substrate 1100.

After the substrate 1100 is disposed, an assembly apparatus 2000 can move along the substrate 1100. The assembly apparatus 2000 can move in contact with the substrate 1100 to maximize the region that a magnetic field reaches to the inside of the fluid 1200. Depending on embodiments, the assembly apparatus 2000 may include a plurality of magnetic materials or a magnetic material having a size corresponding to the substrate 1100. In this case, the movement distance of the assembly apparatus 2000 may be limited within a predetermined range.

The semiconductor light emitting element 1000 in the chamber 1300 can be moved toward the assembly apparatus 2000 by the magnetic field generated by the assembly apparatus 2000. To this end, the magnetic layer having a magnetic material (e.g., nickel (Ni)) may be included in the semiconductor light emitting element 1000.

The semiconductor light emitting element 1000 can be fitted and coupled into the coupling hole 1102 while moving toward the assembly apparatus 2000. For example, a pattern or a shape for coupling in the correct direction may be formed in the coupling hole 1102 and/or the semiconductor light emitting element 1000.

Further, since an electric field is applied to the substrate 1100, it is possible to prevent the coupled semiconductor light emitting element 1000 from being separated by movement of the assembly apparatus 2000.

That is, by the self-assembling type that uses an electromagnetic field, it is possible to remarkably reduce the time that is taken to couple each of the semiconductor light emitting elements to the substrate, so it is possible to quickly and economically implement a large-area and high-pixel display.

However, the magnetic layer of the semiconductor light emitting element 1000 is additionally inserted when a n-type electrode (or, a p-type electrode) is formed in the related art, so the magnetic layer may be disposed in a path through which light is extracted. In this case, since the magnetic layer has low reflectance, the light extraction efficiency of the semiconductor light emitting element 1000 may be deteriorated. In particular, the smaller the size of the semiconductor light emitting element 1000, the more the light extraction efficiency is remarkably reduced.

The structure and manufacturing method of the semiconductor light emitting element 1000 for solving this problem are described hereafter with reference to FIGS. 11 to 16.

Figure 11:
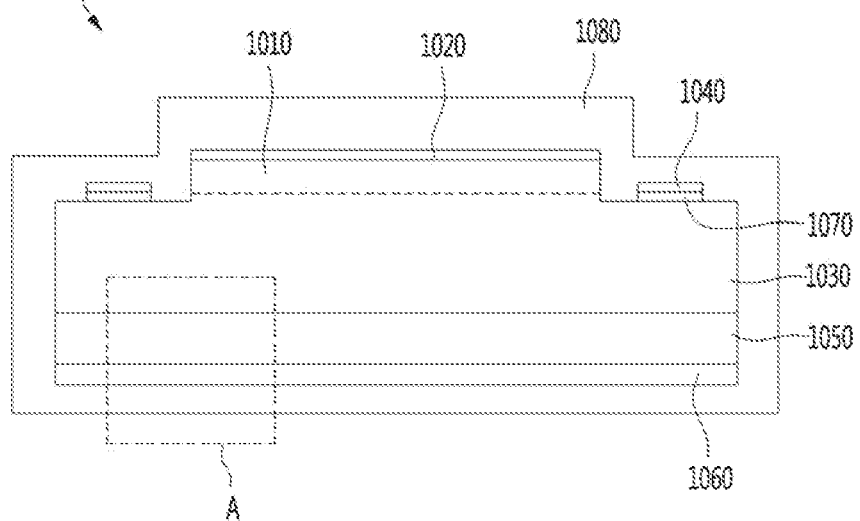
FIG. 11 is a diagram showing an embodiment of the structure of a semiconductor light emitting element related to the assembly method of FIG. 10.
Figure 12:
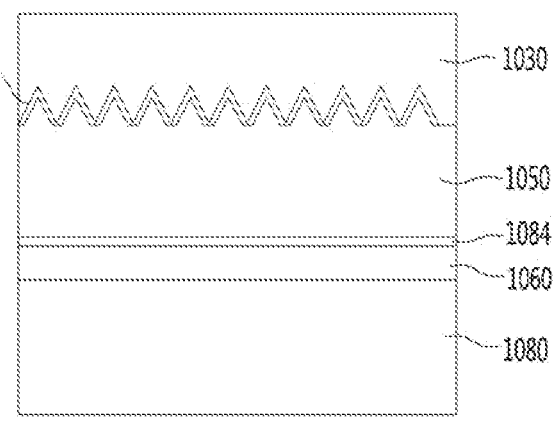
FIG. 12 is an enlarged view of the part A of FIG. 11.
Figure 13:
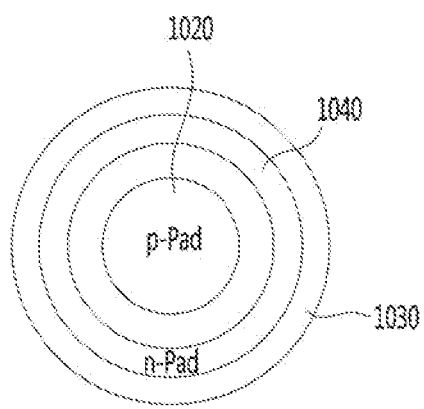
FIG. 13 is a plan view showing the semiconductor light emitting element of FIG. 11 from above.

FIG. 11 is a diagram showing an embodiment of the structure of a semiconductor light emitting element related to the assembly method of FIG. 10. FIG. 12 is an enlarged view of the part A of FIG. 11. FIG. 13 is a plan view showing the semiconductor light emitting element of FIG. 11 from above.

It is assumed in the following description referring to the figures that the semiconductor light emitting element 1000 is a horizontal semiconductor light emitting element. However, the present disclosure is not limited only to a horizontal semiconductor light emitting element and may be similarly applied also to a vertical semiconductor light emitting element.

Further, an upward direction of the semiconductor light emitting element 1000 may mean the direction in which the p-type electrode 1020 is positioned and a downward direction may mean the direction in which the magnetic layer 1060 is positioned in the following figures. In this case, light that is emitted from the semiconductor light emitting element 1000 can be discharged outside through the upper portion of the semiconductor light emitting element 1000.

Referring to FIG. 11, the semiconductor light emitting element 1000 may include a p-type semiconductor layer 1010, a p-type electrode 1020 formed on the p-type semiconductor layer 1010, a n-type semiconductor layer 1030 formed under the p-type semiconductor layer 1010, and a n-type electrode 1040 formed in a partial region on the n-type semiconductor layer 1030. For example, the partial region on the n-type semiconductor layer 1030 may be a region exposed by removing a portion of the p-type semiconductor layer 1010 through etching, etc.

The p-type electrode 1020 may be implemented as a transparent electrode ((Indium Tin Oxide film; ITO) and the n-type electrode 1040 may be made of metal having high electrical conductivity for ohmic contact.

Meanwhile, a magnetic layer 1060 may be formed under the n-type semiconductor layer 1030. The magnetic layer 1060 may include a magnetic material having magnetism such as nickel Ni.

That is, unlike semiconductor light emitting elements in the related art, in the semiconductor light emitting element 1000 according to an embodiment of the present disclosure, the magnetic layer 1060 may be formed under the n-type semiconductor layer 1030. Accordingly, it is possible to prevent the problem of deterioration of light extraction efficiency due to failure to be discharged due to the magnetic layer 1060 when light is emitted through the upper portion of the semiconductor light emitting element 1000.

However, since the magnetic layer 1060 has low light reflection efficiency, some light traveling toward the magnetic layer 1060 of the light extracted from the semiconductor light emitting element 1000 may be absorbed by the magnetic layer 1060. In this case, a problem that the light extraction efficiency is not greatly improved may be generated.

Accordingly, the semiconductor light emitting element 1000 according to an embodiment of the present disclosure may further include a reflective layer 1050 formed between the n-type semiconductor layer 1030 and the magnetic layer 1060. The reflective layer 1050 may be made of metal having high reflectance such as aluminum (Al) and silver (Ag).

Depending on embodiments, an assistant reflective layer 1070 may be further formed between the n-type electrode 1040 and the n-type semiconductor layer 1030. The assistant reflective layer 1070 may be made of metal (aluminum, etc.) having conductivity.

Referring to FIG. 13, light produced from the semiconductor light emitting element 1000 can be discharged outside through the upper portion of the p-type electrode 1020. That is, the pixel region of the semiconductor light emitting element 1000 may correspond to the p-type electrode 1020. In this case, the more the amount of the light discharged through the upper portion of the p-type electrode 1020, the more the light extraction efficiency of the semiconductor light emitting element 1000 can increase. Meanwhile, the semiconductor light emitting element 1000 may be formed in a circular shape when seen from above, but it is not necessary.

The assistant reflective layer 1070 can reflect back the light traveling to the n-type electrode 1040 of the light reflective by the reflective layer 1050. Accordingly, much light can be discharged through the upper region of the p-type electrode 1020 that corresponds to the region through which light is emitted outside, so the light extraction efficiency can be further increased.

Further, the semiconductor light emitting element 1000 may further include a passivation layer 1080 surrounding the components 1010~1070 described above. The passivation layer 1080 may be formed to block the components 1010~1070 from the outside. Accordingly, it is possible to minimize the problem of inefficient assembly due to magnetization of the magnetic layer 1060 due to contact among the semiconductor light emitting elements put in the fluid 1200 or due to lumping of the semiconductor light emitting elements.

On the other hand, the n-type semiconductor layer 1030, the reflective layer 1050, and the magnetic layer 1060 are described in more detail hereafter with reference to FIG. 12.

The contact surfaces of the n-type semiconductor layer 1030 and the reflective layer 1050 may be formed as non-planar surfaces. For example, the contact surfaces may be formed as irregular non-planar surfaces. Accordingly, the light radiated to the reflective layer 1050 can be reflected in various directions, so the light uniformity of the semiconductor light emitting element 1000 can be improved.

On the other hand, the semiconductor light emitting element 1000 may include a first adhesive member 1082 for increasing the adhesion between the n-type semiconductor layer 1030 and the reflective layer 1050 and a second adhesive member 1084 for increasing adhesion between the reflective layer 1050 and the magnetic layer 1060. The adhesive members 1082 and 1084 may be made of chromium (Cr) or Titanium (Ti).

Figure 14:
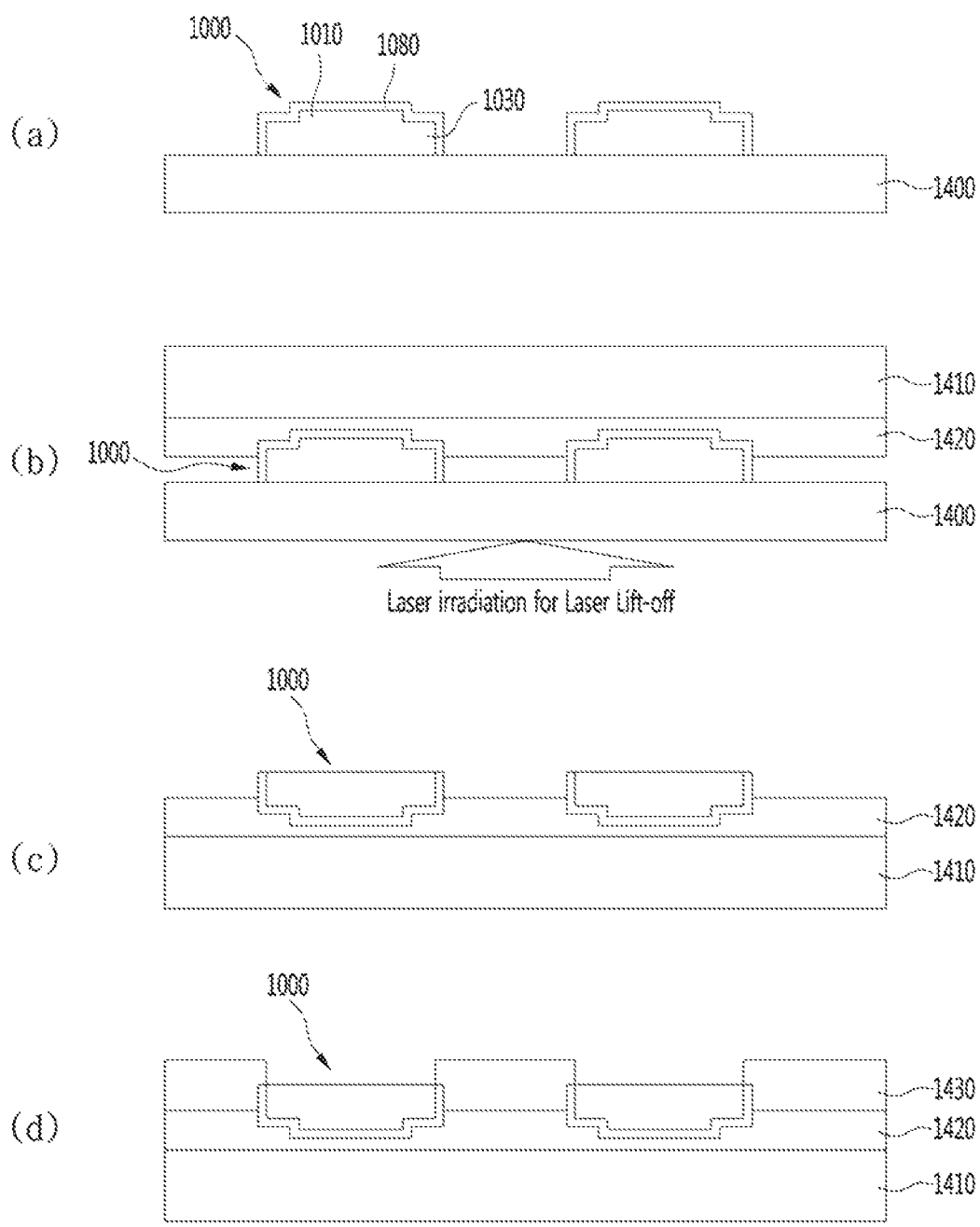
Figure 15:
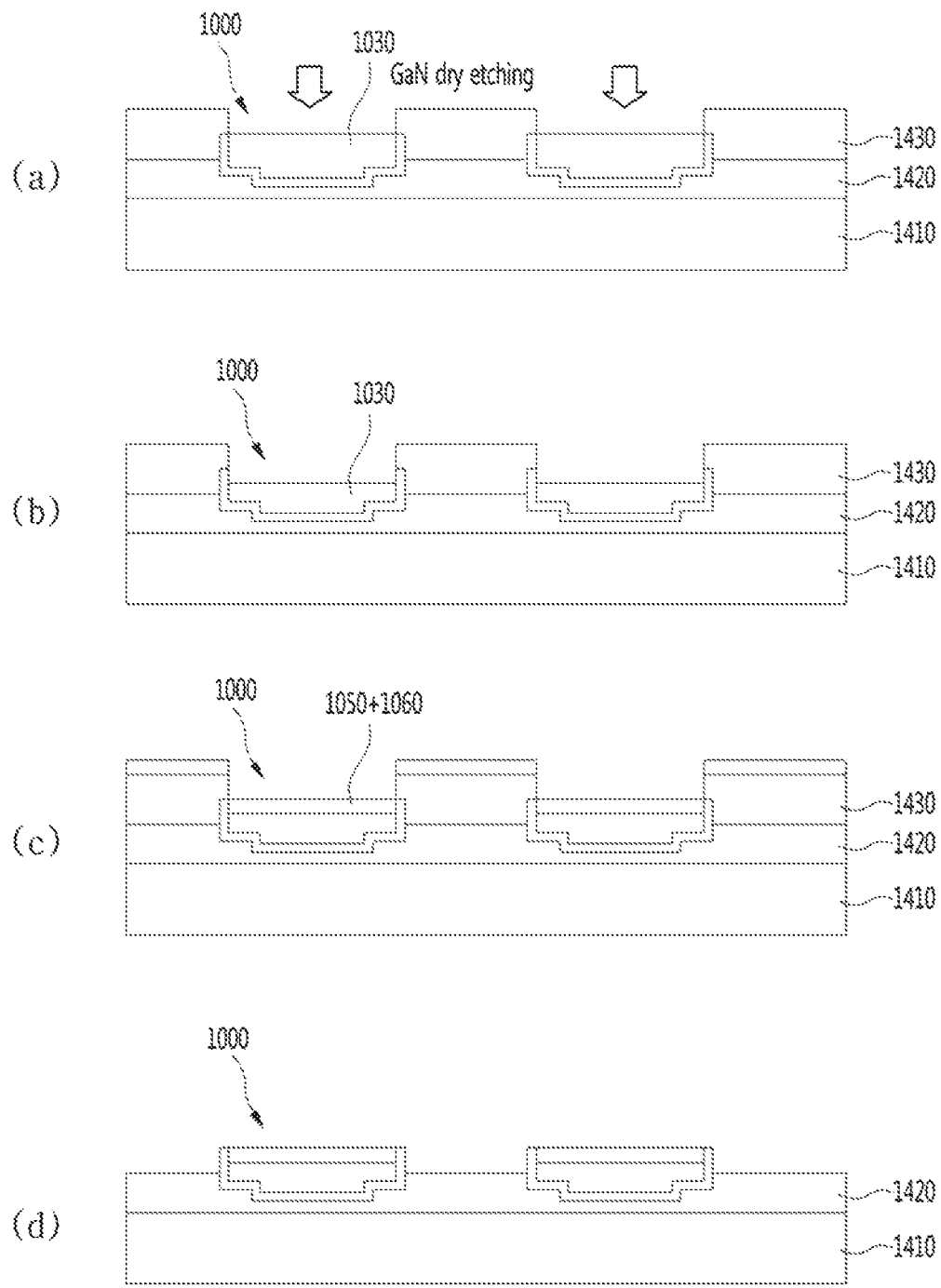

FIGS. 14 to 16 are diagrams for describing a method of manufacturing the semiconductor light emitting element according to the embodiment of FIG. 11.

Referring to (a) of FIG. 14, a semiconductor growth process that sequentially grows the n-type semiconductor layer 1030 and the p-type semiconductor layer 1010 on a growth substrate 1400 may be performed. The growth substrate 1400 may be a sapphire substrate or a silicon substrate.

A portion of the p-type semiconductor layer 1010 formed on the n-type semiconductor layer 1030 can be removed (etched, etc.) so that a portion of the n-type semiconductor layer 1030 is exposed upward. For example, when the semiconductor light emitting element 1000 is formed in a circular shape when seen from above, the other region except for a predetermined region can be removed with respect to the center portion of the p-type semiconductor layer 1010. Since a partial region of the p-type semiconductor layer 1010 is removed, a partial region of the n-type semiconductor layer 1030 can be exposed upward.

Thereafter, the p-type electrode 1020 may be formed on the top surface of the p-type semiconductor layer 1010 and the n-type electrode 1040 may be formed on a portion of the top of the n-type semiconductor layer 1030. As described above, the p-type electrode 1020 may be implemented as a transparent electrode (ITO) to discharge light outside and the n-type electrode 1040 may be made of metal having high electric conductivity for ohmic contact. Depending on embodiments, the assistant reflective layer 1070 is formed on a portion of the top surface of the n-type semiconductor layer 1030 and then the n-type electrode 1040 may be formed on the assistant electrode 1070.

After the p-type electrode 1020 and the n-type electrode 1040 are formed, the passivation layer 1080 may be formed. In this case, since the bottom surface of the semiconductor light emitting element 1000 is in contact with the growth substrate 1400, the passivation layer 1080 may be formed on the top surface and the sides of the semiconductor light emitting element 1000.

Referring to (b) to (c) of FIG. 14, the growth substrate 1400 may be separated from the semiconductor light emitting element 1000 to form the reflective layer 1050 and the magnetic layer 1060 under the n-type semiconductor layer 1030.

To this end, the semiconductor light emitting element 1000 may be fixed to another substrate (e.g., a temporary substrate 1410) after the growth substrate 1400 is separated. To this end, an adhesive member 1420 that fixes the semiconductor light emitting element 1000 to the temporary substrate 1410 by being bonded to at least a portion of the top surface of the semiconductor light emitting element 1000 may have been applied to the temporary substrate 1410. The adhesive member 1420 may be made of PDMS (Polydimethylsiloxane), but is not limited thereto.

Meanwhile, the temporary substrate 1410 is made of a material having high heat resistance such as silicon, glass, sapphire, thereby being able to prevent deformation or damage, depending on the manufacturing process of the semiconductor light emitting element 1000 that is performed later.

When the semiconductor light emitting element 1000 is fixed to the temporary substrate 1410, the growth substrate 1400 can be removed from the semiconductor light emitting element 1000 through an LLO (Laser Lift-Off) process.

Referring to (d) of FIG. 14, the semiconductor light emitting element 1000 can be fixed to the temporary substrate 1410 in a flipped type such that the n-type semiconductor layer 1030 faces up. Thereafter, a photoresist (PR) 1430 is applied to the flipped semiconductor light emitting element 1000 and the PR in the region corresponding to the n-type semiconductor layer 1030 can be removed through an exposure process.

Referring to (a) and (b) of FIG. 15, an etching process that etches a portion of the n-type semiconductor layer 1030 exposed upward may be performed. For example, the etching process may correspond to a wet etching process that etches the n-type semiconductor layer 1030 using reactive ion etching (RIE), but is not limited thereto. An RIE apparatus can etch the n-type semiconductor layer 1030 using ions and radical existing due to etching gas (e.g., argon (Ar), chorine ($Cl_2$), or boron trichloride) produced in a plasma state.

Meanwhile, the etching process may be formed such that the etched surface of the n-type semiconductor layer 1030 becomes a non-planar surface (e.g., an irregular pattern). For example, the vertical height of the etched surface may be maximally within 100 nm, but is not limited thereto.

As described above with reference to FIG. 12, since the etched surface becomes a non-planar surface, light is reflected in various directions by the reflective layer 1050, so the light uniformity can be improved. Further, the coupling force between the n-type semiconductor layer 1030 and the reflective layer 1050 can be increased, as compared with the case in which the etched surface of a flat surface.

Referring to (c) of FIG. 15, a process of forming the reflective layer 1050 and the magnetic layer 1060 on the etched n-type semiconductor layer 1030 may be performed. For example, the reflective layer 1050 and the magnetic layer 1060 may be deposited on the n-type semiconductor layer 1030 by electronic beam (E-beam) equipment.

Meanwhile, as shown in FIG. 12, before the reflective layer 1050 is deposited on the n-type semiconductor layer 1030, a process of depositing the first adhesive member 1082 on the n-type semiconductor layer 1030 may be performed first. Thereafter, the reflective layer 1050 is deposited on the first adhesive layer 1082, whereby the coupling force between the n-type semiconductor layer 1030 and the reflective layer 1050 can be improved.

Further, after the reflective layer 1050 is deposited, a process of depositing the second adhesive member 1084 on the reflective layer 1050 may be performed. Depending on embodiments, before the second adhesive member 1084 is deposited, a process of planarizing the top surface of the reflective layer 1050 may be performed first. The planarizing process can be performed by additionally depositing a reflective layer 1050, but is not necessarily limited thereto.

After the second adhesive member 1084 is deposited, the magnetic layer 1060 may be deposited on the second adhesive member 1084. Since the planarizing process is performed, the magnetic layer 1060 can be formed with more uniform thickness.

Meanwhile, the reflective layer 1050 and the magnetic layer 1060 may be formed also on the photoresist 1430.

Referring to (d) of FIG. 15, after the reflective layer 1050 and the magnetic layer 1060 are formed, the photoresist 1430, and the reflective layer and the magnetic layer formed on the photoresist 1430 can be removed from the temporary substrate 1410 and the semiconductor light emitting element 1000 through a lift-off process.

Referring to (a) of FIG. 16, the passivation layer 1080 for blocking the magnetic layer 1060 exposed to the outside from the outside may be additionally deposited. Accordingly, the components included in the semiconductor light emitting element 1000 can be blocked from the outside by the passivation layer 1080. Though not shown in the figures, regions of the passivation layer 108 that correspond to the p-type electrode 1020 and the n-type electrode 1040 may be removed (etched) for connection of power after being assembled to the substrate 1100 later.

Referring to (b) of FIG. 16, the temporary substrate 1410 and the adhesive member 1420 are removed from the semiconductor light emitting element 1000, and the semiconductor light emitting element 1000 can be put into the chamber 1300 filled with the fluid 1200. The semiconductor light emitting element 1000 is surrounded by the passivation layer 1080, so it is possible to prevent the fluid 1200 from permeating into the internal components 1010~1070.

Referring to (c) of FIG. 16, as described above with reference to FIG. 10, the substrate 1100 is disposed on the chamber 1300 (or put into the chamber 1300) and the assembly apparatus having a magnetic material is positioned over the substrate 1100, the semiconductor light emitting element 1000 in the fluid 1200 can be fitted and coupled in the coupling hole 1102 of the substrate 1100. Further, since an electric field is applied to the substrate 1100, it is possible to prevent the coupled semiconductor light emitting element 1000 from being separated by movement of the assembly apparatus 2000. Meanwhile, the coupling hole 1102 may be formed by removing (etching) a portion of the insulating layer 1104 formed on the substrate 1100.

According to an embodiment of the present disclosure, since the magnetic layer of a semiconductor light emitting element that is assembled in a self-assembling type that uses an electromagnetic field is disposed in the opposite direction to the light emission direction, it is possible to effectively prevent deterioration of light emission efficiency due to light absorption by the magnetic layer.

Further, since the semiconductor light emitting element includes a reflective layer disposed between the magnetic layer and a semiconductor layer, it is possible to maximize a light emission efficiency by reflecting the light traveling to the magnetic layer.

Further, since the reflective layer has a non-planar surface, it reflects light in various directions, whereby uniformity of light emitted from the semiconductor light emitting element can be improved.

Further, since the semiconductor light emitting element includes an assistant reflective layer formed between the n-type semiconductor layer and the n-type electrode, it is possible to maximize the amount of light discharged to the upper portion of the p-type electrode.

The above description merely explains the spirit of the present disclosure and the present disclosure may be changed and modified in various ways without departing from the spirit of the present disclosure by those skilled in the art.

Accordingly, the embodiments described herein are provided merely not to limit, but to explain the spirit of the present disclosure, and the spirit of the present disclosure is not limited by the embodiments.

The protective range of the present disclosure should be construed by the following claims and the scope and spirit of the present disclosure should be construed as being included in the patent right of the present disclosure.

What is claimed is:

1. A semiconductor light emitting element comprising:
   a first conductivity type semiconductor layer;
   a second conductivity type semiconductor layer in a first region on the first conductivity type semiconductor layer,
   a second electrode on the second conductivity type semiconductor layer;
   a first electrode in a second region different from the first region on the first conductivity type semiconductor layer;
   a magnetic layer under the first conductivity type semiconductor layer,
   a reflective layer between the first conductivity type semiconductor layer and the magnetic layer, and
   a passivation layer covering at least two of the first conductivity type semiconductor layer, the second conductivity type semiconductor layer, the second electrode, the first electrode, or the magnetic layer,
   wherein the second electrode is implemented as a transparent electrode, and the first electrode is made of metal.

2. The semiconductor light emitting element of claim 1, further comprising a first adhesive member between the first conductivity type semiconductor layer and the reflective layer.

3. The semiconductor light emitting element of claim 2, wherein the first adhesive member is made of at least one of chromium or titanium.

4. The semiconductor light emitting element of claim 2, wherein the first adhesive member comprises a first uneven surface pattern.

5. The semiconductor light emitting element of claim 1, wherein contact surfaces of the first conductivity type semiconductor layer and the reflective layer are formed as non-planar surfaces.

6. The semiconductor light emitting element of claim 1, further comprising an assistant reflective layer formed between the first electrode and the first conductivity type semiconductor layer.

7. The semiconductor light emitting element of claim 1, wherein the reflective layer comprises a second uneven surface pattern.

8. A display device comprising the semiconductor light emitting element of claim 1.

9. The semiconductor light emitting element of claim 1, wherein the passivation layer surrounds the reflective layer.

10. A semiconductor light emitting element comprising:
    a first conductivity type semiconductor layer;
    a second conductivity type semiconductor layer in a first region on the first conductivity type semiconductor layer;
    a second electrode on the second conductivity type semiconductor layer;
    a first electrode in a second region different from the first region on the first conductivity type semiconductor layer;
    a magnetic layer under the first conductivity type semiconductor layer;
    a reflective layer between the first conductivity type semiconductor layer and the magnetic layer;
    a passivation layer covering at least two of the first conductivity type semiconductor layer, the second conductivity type semiconductor layer, the second electrode, the first electrode, or the magnetic layer;
    a first adhesive member between the first conductivity type semiconductor layer and the reflective layer; and
    a second adhesive member between the reflective layer and the magnetic layer.

11. A semiconductor light emitting element comprising:
    a first conductivity type semiconductor layer;
    a second conductivity semiconductor layer in a first region on the first conductivity type semiconductor layer;
    a second electrode formed on the second conductivity semiconductor layer;
    a first electrode formed in a second region different from the first region on the first conductivity type semiconductor layer;
    a magnetic layer under the first conductivity type semiconductor layer;
    a reflective layer between the first conductivity type semiconductor layer and the magnetic; and
    an assistant reflective layer formed between the first electrode and the first conductivity type semiconductor layer,
    wherein the reflective layer comprises a second uneven surface pattern.

12. The semiconductor light emitting element of claim 11, further comprising a first adhesive member between the first conductivity type semiconductor layer and the reflective layer; and
    a second adhesive member between the reflective layer and the magnetic layer.

13. The semiconductor light emitting element of claim 12, wherein the first adhesive member and the second adhesive member are made of at least one of chromium or titanium.

14. The semiconductor light emitting element of claim 12, wherein the first adhesive member comprises a first uneven surface pattern.

15. The semiconductor light emitting element of claim 11, further comprising a passivation layer surrounding the first conductivity type semiconductor layer, the second conductivity semiconductor layer, the second electrode, the first electrode, and the magnetic layer.

16. The semiconductor light emitting element of claim 15, wherein the passivation layer surrounds the reflective layer.

17. The semiconductor light emitting element of claim 11, wherein contact surfaces of the first conductivity type semiconductor layer and the reflective layer are formed as non-planar surfaces.

18. A display device comprising the semiconductor light emitting element of claim 11.

\* \* \* \* \*